(12) United States Patent
Ge et al.

(10) Patent No.: US 9,261,242 B2
(45) Date of Patent: Feb. 16, 2016

(54) LED LIGHT BULB AND LED LIGHT-EMITTING STRIP BEING CAPABLE OF EMITTING 4TT LIGHT

(75) Inventors: Shichao Ge, Hangzhou (CN); Huabin Liu, Hangzhou (CN); Tiehan Ge, Hangzhou (CN)

(73) Assignee: Zhejiang Ledison Optoelectronics Co., Ltd., Hangzhou (CN)

( * ) Notice: Subject to any disclaimer, the term of this patent is extended or adjusted under 35 U.S.C. 154(b) by 463 days.

(21) Appl. No.: 13/408,936

(22) Filed: Feb. 29, 2012

(65) Prior Publication Data

US 2013/0058080 A1    Mar. 7, 2013

Related U.S. Application Data

(63) Continuation-in-part of application No. PCT/CN2011/079234, filed on Sep. 1, 2011.

(30) Foreign Application Priority Data

| Sep. 8, 2010 | (CN) | 2010 1 0278760 |
| Nov. 22, 2010 | (CN) | 2010 2 0617406 U |
| Dec. 29, 2010 | (CN) | 2010 1 0610092 |
| Dec. 29, 2010 | (CN) | 2010 2 0685204 U |
| May 11, 2011 | (CN) | 2011 2 0148195 U |
| May 11, 2011 | (CN) | 2011 2 0148206 U |
| Aug. 29, 2011 | (CN) | 2011 2 0319651 U |

(51) Int. Cl.
*F21V 19/00* (2006.01)
*F21K 99/00* (2010.01)
(Continued)

(52) U.S. Cl.
CPC . *F21K 9/135* (2013.01); *F21K 9/17* (2013.01); *F21V 3/00* (2013.01); *F21V 19/003* (2013.01);
(Continued)

(58) Field of Classification Search
CPC ............. F21Y 2111/001; F21Y 2103/003; F21K 9/135; F21V 19/003; F21V 19/0035; F21V 19/005
USPC ........................................................ 313/498
See application file for complete search history.

(56) References Cited

U.S. PATENT DOCUMENTS 5,924,784 A * 7/1999 Chliwnyj et al. ............. 362/234
6,787,999 B2    9/2004 Stimac et al.
(Continued)

FOREIGN PATENT DOCUMENTS

| CN | 200510020493.6 A | 10/2005 |
| CN | 2005162323.4 A | 6/2006 |

(Continued)

OTHER PUBLICATIONS

European Patent Office; European Search Report for Corresponding Application No. 11823056.4; Oct. 10, 2013; The Hague.
(Continued)

*Primary Examiner* — Thomas A Hollweg
*Assistant Examiner* — Christopher Raabe
(74) *Attorney, Agent, or Firm* — Michael J. Donohue; Davis Wright Tremaine LLP

(57) ABSTRACT

The present invention discloses a LED light bulb, comprising: a LED light bulb shell; a core column with an exhaust tube and a bracket; at least one LED light emitting strip with LED chips therein emitting 4π light; a driver; and an electrical connector, wherein the LED light bulb shell is vacuum sealed with the core column so as to form a vacuum sealed chamber, which is filled with a gas having a low coefficient of viscosity and a high coefficient of thermal conductivity, the bracket and the LED light emitting strips fixed on the bracket are housed in the vacuum sealed chamber, the LED light emitting strip is in turn electrically connected to the driver, the electrical connector, while the electrical connector is used to be electrically connected to an external power supply, so as to light the LED light emitting strips. In addition, the present invention also provides the LED light emitting strips with LED chips emitting 4π light, as used in the LED light bulb.

13 Claims, 14 Drawing Sheets

(51) Int. Cl.
*F21V 3/00* (2015.01)
*F21V 29/00* (2015.01)
F21Y 101/02 (2006.01)
F21Y 111/00 (2006.01)
F21Y 103/00 (2006.01)

(52) U.S. Cl.
CPC ........... *F21V 19/005* (2013.01); *F21V 19/0035* (2013.01); *F21V 29/004* (2013.01); *F21Y 2101/02* (2013.01); *F21Y 2103/003* (2013.01); *F21Y 2111/001* (2013.01)

(56) References Cited

U.S. PATENT DOCUMENTS

| | | | |
|---|---|---|---|
| 7,144,135 | B2 | 12/2006 | Martin et al. |
| 7,187,141 | B2 * | 3/2007 | Mueller et al. ................. 315/362 |
| 7,347,589 | B2 * | 3/2008 | Ge ................................. 362/294 |
| 7,515,248 | B2 | 4/2009 | Tanitsu et al. |
| 7,535,028 | B2 | 5/2009 | Fan et al. |
| 8,858,027 | B2 * | 10/2014 | Takeuchi et al. .......... 362/249.02 |
| 2003/0214810 | A1 * | 11/2003 | Zhang ............................ 362/294 |
| 2004/0201990 | A1 * | 10/2004 | Meyer ............................ 362/255 |
| 2005/0174769 | A1 * | 8/2005 | Yong et al. .................... 362/235 |
| 2007/0139949 | A1 | 6/2007 | Tanda et al. |
| 2008/0285279 | A1 | 11/2008 | Ng |
| 2009/0103296 | A1 | 4/2009 | Harbers et al. |
| 2009/0184618 | A1 * | 7/2009 | Hakata .................... F21K 9/135 313/1 |
| 2009/0251882 | A1 * | 10/2009 | Ratcliffe .......................... 362/84 |
| 2010/0207502 | A1 * | 8/2010 | Cao et al. ........................ 313/46 |
| 2010/0253221 | A1 * | 10/2010 | Chiang ............................ 315/32 |
| 2011/0074296 | A1 * | 3/2011 | Shen et al. .................... 315/112 |
| 2011/0163681 | A1 * | 7/2011 | Dau et al. ...................... 315/191 |
| 2011/0163683 | A1 * | 7/2011 | Steele et al. ................... 315/192 |
| 2011/0248631 | A1 * | 10/2011 | Chuang ............................ 315/32 |
| 2012/0032577 | A1 * | 2/2012 | Huang ....................... 313/318.01 |
| 2012/0217862 | A1 * | 8/2012 | Matsuda et al. ................ 313/46 |

FOREIGN PATENT DOCUMENTS

| | | |
|---|---|---|
| CN | 2831445 Y | 10/2006 |
| CN | 200510089384.X A | 2/2007 |
| CN | 200580039670.3 A | 10/2007 |
| CN | 201007995 Y | 1/2008 |
| CN | 200610099185.1 A | 2/2008 |
| CN | 200710148853.X A | 3/2008 |
| CN | 101533784 A | 9/2009 |
| CN | 200810093378.5 A | 10/2009 |
| CN | 20091010643.4 A | 2/2010 |
| CN | 20910100681.8 A | 2/2010 |
| CN | 200910250434.6 A | 5/2010 |
| CN | 201502899 U | 6/2010 |
| CN | 101800270 A | 8/2010 |
| CN | 201555054 U | 8/2010 |
| CN | 201010176451.2 A | 8/2010 |
| CN | 101968181 A | 2/2011 |
| CN | 201020159200.9 U | 2/2011 |
| CN | 102109115 A | 6/2011 |
| CN | 201944605 U | 8/2011 |
| CN | 201944638 U | 8/2011 |
| EP | 2236907 A2 | 6/2010 |

OTHER PUBLICATIONS

Australian Patent Office; Australian Examination Report for Corresponding Application No. 2011300999; Nov. 26, 2013; Woden, Australia.

European Patent Office; European Search Report for Corresponding Application No. 11823056.4; Jun. 10, 2014; The Hague, Netherlands.

* cited by examiner

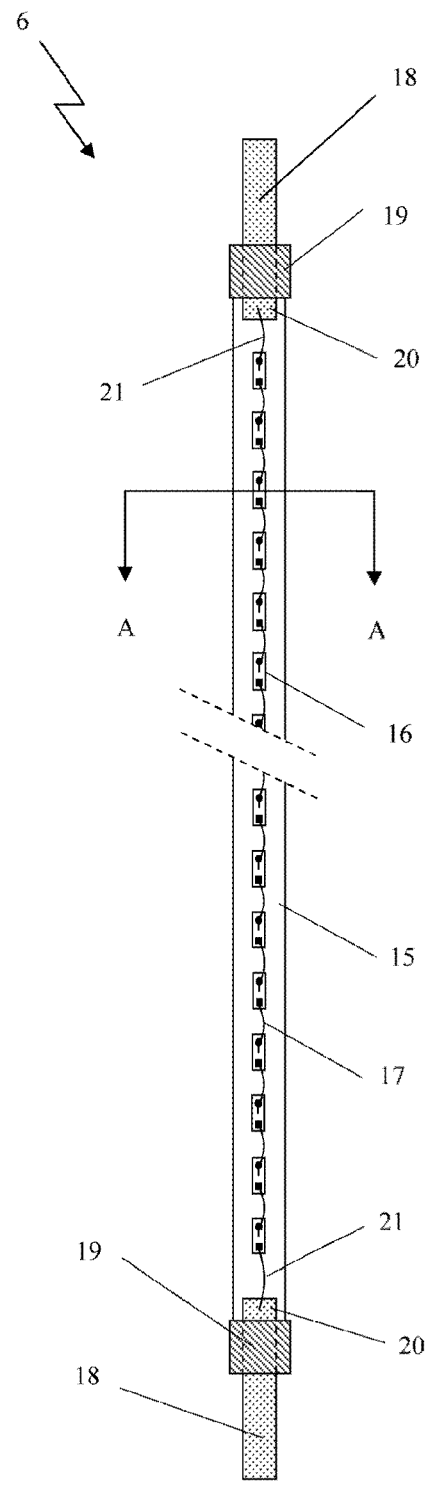
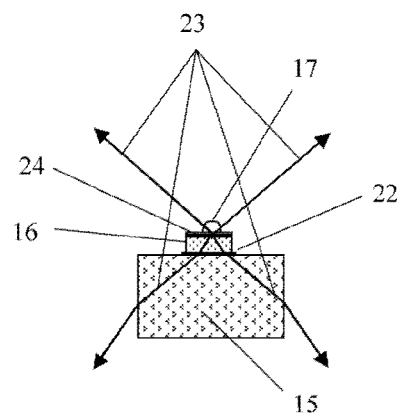
Fig. 7
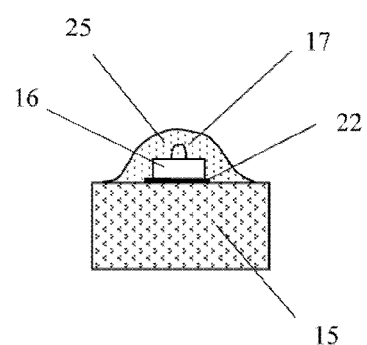
Fig. 8
Fig. 6

LED LIGHT BULB AND LED LIGHT-EMITTING STRIP BEING CAPABLE OF EMITTING 4TT LIGHT

CROSS-REFERENCE TO RELATED APPLICATION

This application is a Continuation-In-Part under 35 U.S.C. §111(a) of PCT/CN2011/079234, filed Sep. 1, 2011 (currently pending), which claims the benefit under 35 U.S.C. §119, to: Chinese Patent Application No. 201010278760.0, filed Sep. 8, 2010; Chinese Patent Application No. 201020617406.1, filed Nov. 22, 2010; Chinese Patent Application No. 201010610092.7, filed Dec. 29, 2010; Chinese Patent Application No. 201020685204.0, filed Dec. 29, 2010; Chinese Patent Application No. 201120148195.6, filed May 11, 2011; Chinese Patent Application No. 201120148206.0, filed May 11, 2011; Chinese Patent Application No. 201120319651.9, filed Aug. 29, 2011," the disclosures of which are incorporated herein by reference.

FIELD OF INVENTION

The present invention relates to a field of lighting techniques, more particularly, to a LED light emitting strip and a light bulb using the same.

BACKGROUND OF INVENTION

In prior art, a LED light bulb in place of an incandescent lamp typically is composed of one or more power type LED(s), a metal based PCB(MPCB), a heat sink with a series of dissipating fins, a driver including a switching power supply and a constant-current device, a connecting member, an anti-dazzle bulb shell and an electrical connector. Currently, a luminescent efficiency of such light bulb has caught up with that of widely used energy-saving fluorescent lamps. The luminescent efficiency of the entire energy-saving fluorescent lamps is 40-70 lm/W, but the luminescent efficiency of white LED element is already up to 130 lm/W. Therefore, the efficiency of the LED light bulb needs to be further improved. The main problems for the current LED light bulb lie in too high costs and sale prices, which are several times those of the energy-saving fluorescent lamps at the condition of same luminous flux, thereby being difficult to popularize. The factor resulting in high cost is not caused by the LED chip itself, but by the high cost aluminum alloy heat sink, the driver comprising a switching mode power supply having a transformer and a constant-current device as well as LED packaging. Such driver not only has a high cost, but also has a low efficiency. In addition, this driver further includes elements such as triode, transformer and electrolytic capacitor which have a short lifetime which is not matched with that of the LED. The average nominal lifetime of these elements is generally less than 25,000 hours, while the lifetime of LED itself should be up to 50,000-100,000 hours. That is, LED light bulb in the prior art for replacing the incandescent lamp has a relatively low luminescent efficiency of the entire light, too high cost, and not much long lifetime. If the LED light bulb is intended to replace the incandescent lamp and the energy-saving fluorescent lamp being widely used, and becomes main current of the general lighting, then the efficiency thereof should be further increased, the cost should be significantly decreased, the service lifetime should be elongated, and they should have the substantially same weight and volume as those of the incandescent lamp.

Light emitted from LED originates from PN junction of LED. The PN junction originally is a 4π illuminant. In the prior art, in order to concentrate light or connect with a metal heat sink, the PN junction of LED is arranged with a reflective layer, a reflective cup or a heat sink at one side thereof, that is, the original 4π illuminant is made as 2π or less than 2π illuminant. Thus, 2π light rays which are directed toward the heat sink, will outgo therefrom after single reflection, multiple reflections and various absorptions; while a part of 2π light rays which are directed toward a light outgoing surface, also will outgo after reflection, multiple reflections and various absorptions, since this part of 2π light will be directed toward the heat sink, thereby largely decreasing a light outgoing rate of the PN junction, i.e., the efficiency of the LED is decreased. Currently, an internal quantum efficiency of light emitted by the PN junction of the LED is already close to 90%, while external quantum efficiency thereof is only about 30%. The phrase of "the internal quantum efficiency being 90%" means that within the PN junctions, only 10% of injected electrons are drained without generating photon, while each of 90% of injected electrons generates a photon. However, one important reason for "the external quantum efficiency being only about 30%" is that the PN junction originally emitting 4π light becomes a 2π illuminator. If the PN junction of LED can be capable of emitting 4π light, it will certainly significantly enhance the luminescent efficiency of the LED.

With regard to this, researches have been previously carried out. For example, Chinese Patent No. 200510089384.X describes that a single LED chip is suspended in a light transmitting substance, so as to enable the chip to emit 4π light. However, this does not solve a problem of heat dissipation of the chip. This chip is suspended without a support plate and thus the power leads on the chip have a poor reliability. Thus, only a single small power chip can be used, and it is difficult to produce a reliable light having sufficient output light flux. And for example in United States (US) published patent application No. 2007/0139949, a plurality of small chips are in series installed on an expensive transparent thermal conducting substrate, such as sapphire, diamond, GaN, or an opaque thermal conducting substrate such as copper, SiC. Then the LED light bulb having a shape of the incandescent lamp is formed by connecting the above described substrate to a bulb head by thermal conducting lead wires and a bracket so as to dissipate heat, and providing a bulb shell at the outside thereof, which is not vacuum sealed, but filled with air therein and communicated with the ambient atmosphere. As described in the above US patent application, this the transparent thermal conducting substrate such as sapphire and diamond is very expensive and is difficult to be practical; and since the copper, SiC and the like are not transparent, it is impossible to achieve emitting 4π light. A path of dissipating heat for this kind bulb is chip→thermal conducting substrate→thermal conducting lead wire→thermal conducting bracket→bulb head. The path of dissipating heat ends the bulb head, resulting in a difficulty of making a thermal connection and a limited effect of dissipating heat. If the bulb head has the driver for the LED, then it will cause the path of dissipating heat to be disrupted and failed. At this condition, if the light bulb is vacuum sealed, then the path of dissipating heat will also be broken down. Therefore, it is difficult to produce a practical light having sufficient output luminous flux.

In the prior art, majority of the LED light bulbs employ power type LED having a low voltage and a high current. Each LED chip has one PN junction, its working current is as large as 0.35 A, even several amperes, and the electric power of 1 W to several Watts and above is concentrated on area of one to several square millimeters of the chip. Since the external quantum efficiency thereof is only about 30%, in addition to an energy difference between the injected electron and the photon generated by it as well as an energy difference between the photon generated by the PN junctions and the finally outgoing photon, about 70% of the electric power will be transformed into heat. How to dissipate so much heat is always a critical problem since this type of power LED first appears. LED is a semiconductor device, and a temperature rise of PN junctions thereof will cause the luminescent efficiency to be rapidly decreased, even the burning down of the PN junctions. To the present day, the heat dissipation is still one critical problem of this type of low voltage and high current power type LED lighting, including LED light bulbs.

In order to solve the problem of heat dissipation, the LED light bulb in the prior art mainly employs the metal passive heat sink having dissipating fins. The materials and shapes for this heat sink as well as how to increase the convective heat exchange with air have been studied and described in patents, for example, Chinese Patent No. 200510062323.4 and U.S. Pat. Nos. 6,787,999 and 7,144,135. This metal heat sink is typically made of aluminum alloy and has a bulky volume, a heavy weight and a high price. It is one of critical factors for high cost of the LED light bulb in the prior art.

Instead of the above described metal heat sink, the heat dissipation by means of liquid has also been studied, for example, Chinese Patent Nos. 200810093378.5, 200910100681.8, and 200910101643.4. The LED have been placed into a sealed bulb shell which is filled with thermal conducting liquid capable of transmitting light, which can be for example water, oil, glycol or other inert liquid. On one hand, the liquid has a much lower coefficient of thermal conductivity than that of the metal. As one example, the coefficient of thermal conductivity of water is about 0.7 W/(m·K), while the coefficient of thermal conductivity of the metal is 50-415 W/(m·K). The coefficient of thermal conductivity of the aluminum alloy which is commonly used in the heat sink of the LED light bulb, is 96-226 W/(m·K). It can be seen from the above that the liquid has a much lower thermal conductivity than that of the metal. On the other hand, since the coefficient of viscosity of the liquid is very large, for example, water having 8937 µP of viscosity, it is difficult for them to create convection. Concerning the above, the liquid has poor effects of thermal conduction and convection heat dissipation. Moreover, the use of liquid to dissipate heat also gives rise to the problems such as electroanalysis of the liquid, erosion of the liquid to the LED, the heat dissipation failure or even explosion caused by formation of a gas phase layer at a surface of LED likely due to the phase transition of the liquid, the liquid contamination caused after the breakage of the bulb shell, and the heavy weight. Thus, it is not easy to practically use and popularize it.

Use of gas for dissipating heat has already been studied, instead of the above described metal (solid) and liquid for heat dissipation. For example, the LED light bulb of Chinese Patent No. 201010176451.2 utilizes the nitrogen anion sealed in the bulb shell to dissipate heat. And for example, the LED light bulb of Chinese Patent No. 200910250434.6 utilizes a mixed gas of nitrogen and argon sealed in the bulb shell to dissipate heat. These methods are not practically used up to now. In addition to these LED light bulbs, other types of the lamps (such as cold cathode fluorescent lamps) may dissipate heat by applying high thermal conductivity of gas (such as He or a mixed gas of He with $H_2$), for example as described in the Chinese Patent No. 200710148853.X. But it is difficult to create a limited convection, resulting in the limited effect of thermal conduction and dissipation, since the tube of the cold cathode fluorescent lamp has a large volume, which nearly occupies all the bulb shell. Therefore, it is not practically used today. And for example, metal halogen lamps also employ filling the bulb shell with the gas such as nitrogen and/or hydrogen, as can be seen from Chinese Patent No. 200580039670.3. The incandescent lamp also can be filled with the gas such as nitrogen and/or hydrogen. However, these lamps are different from the LED light.

Besides the above problem of heat dissipation, the LED light bulb in the prior art also has a driving problem of transforming the commercial high voltage power into the low voltage and high current. As described previously, the majority of the LED light bulbs in the prior art are power type LED operating at the condition of direct current, low voltage and high current. Their working voltages are in the range from several volts to tens of volts and their currents are in the range from 0.35 A to several Amperes. The current incandescent lamp and energy-saving fluorescent lamp for general lighting directly use the commercial alternating current with a voltage of 110-230V. Thus, if it is intended to directly replace them, then a driver including a AC/DC convertor will be necessary, so as to transform the alternating current with the high voltage into the direct current with the low voltage and a high current value. Such driver generally includes a switching power supply with elements such as triodes, transformers and electrolytic capacitors, and a constant current circuit. Since the volume of the LED light for replacing the incandescent lamp is not too large, the volume of the driver and the transformers should be kept as small as possible, while the difference between the input voltage and the output voltage is very large; this results in a low efficiency for electrical transformation, typically 70%-80%. This reduces the luminescent efficiency of the entire light. Meanwhile, because its efficiency is low, it generates a large amount of heat. Taking into consideration of the above generated heat by the driver and the heat generated by LED, the temperature of the driver will readily rise, thus this does not only further decrease the efficiency of the driver, but also will shorten lifetime of the driver. The elements such as triodes, transformers and electrolytic capacitors which are sensitive to temperature, are included in the driver. As temperature rises, their efficiency, lifetime and reliability will be significantly reduced. This renders the lifetime of the LED light bulb in the prior art to be not mainly dependent on LED, but on the driver. Moreover, the driver containing the switching power supply with the transformer and the constant current circuit has a complicated circuit and a high requirement on the elements, thus the cost thereof is high, which is another critical factor of leading to the high price of the prior art LED light bulb.

In order to replace such driver, a technology called as ACLED (alternating current LED) is being developed, as can be seen in for example Chinese Patent Nos. 200510020493.6 and 200610099185.1 and U.S. Pat. Nos. 7,515,248 and 7,535,028 as well as product AX3221 et al. A series of small current LED chips are connected in series in a way similar to a bridge rectifier circuit, installed on a MPCB, and provided with a heat sink. They can directly operate with the commercial alternating current and the driving circuit thereof is relatively simple. However, such LED currently has a relatively low efficiency, and it needs to tightly and thermally connect to a metal heat sink which has to be exposed in the air. Since ACLED is connected with a high voltage of alternating current, the metal heat sink will easily be charged and thus be unsafe. The prior art HVLED (high voltage LED), for example as described in Chinese Patent No. 201020159200.9, also has the same safety issues.

Furthermore, the LED is a kind of point light source, and about 100 lm of light will be concentrated on an area of about 1 mm$^2$, thus an intensity of the light will be up to about tens of millions nits. If a person looks it in the eye directly, and will create a strong glare, thus leaving a shadow in the field of vision, then the eyesight will be heavily impacted within a short time. Therefore, the domestic lights should be provided with an antidazzle bulb shell or other devices for dispersing light. In order to obtain a good feel for the light, a light diffusing layer of the antidazzle bulb shell needs to have a sufficient thickness, while this will also reduce the transmission efficiency of the bulb shell. Typically, this will lose about 15% of light. This in turn reduces the luminescent efficiency of the entire light.

Concerning the above, if the prior art LED light is intended to widely replace the incandescent lamp and the energy-saving fluorescent light, for general lighting, then the LED light shall have a further improved luminescent efficiency, significantly reduced cost, an elongated life time, and volume and weight close to those of the incandescent lamp.

SUMMARY OF INVENTION

In view of the above shortages in prior arts, an object of the present invention is to alleviate at least one aspect of the above problems and defects.

Accordingly, one object of the present invention is to provide a LED light emitting strip being capable of emitting 4π light with a high efficiency.

One object of the present invention is to provide a highly efficient LED light bulb with LED chips emitting 4π light with a high efficiency.

Another object of the present invention is to provide a low cost highly efficient LED light bulb with LED chips emitting 4π light.

A further object of the present invention is to provide a long life time highly efficient LED light bulb with LED chips emitting 4π light.

A yet further object of the present invention is to provide a highly efficient LED light bulb with LED chips emitting 4π light, which has volume and weight close to those of an incandescent lamp.

In accordance with one aspect of the present invention, a LED light bulb is provided, comprising: a LED light bulb shell; a core column with a exhaust tube and a bracket; at least one LED light emitting strip with LED chips therein emitting 4π light; a driver; and an electrical connector, wherein the LED light bulb shell is vacuum sealed with the core column so as to form a vacuum sealed chamber, which is filled with a gas having a low coefficient of viscosity and a high coefficient of thermal conductivity, the bracket and the LED light emitting strip fixed on the bracket are housed in the vacuum sealed chamber, the LED light emitting strip is in turn electrically connected to the driver, the electrical connector, and the electrical connector is used to electrically connect to an external power supply, so as to light the LED light emitting strips.

In accordance with another aspect of the present invention, a LED light emitting strip with LED chips emitting 4π light is provided, wherein the LED light emitting strip comprises a transparent substrate and at least one series of LED chips on the transparent substrate connected in series in such a manner that the PN junctions therein have a same direction, the LED chips having transparent chip substrates, electrodes of the LED chips being led by an electrode leading device of the LED chips disposed at two ends of the transparent substrate, wherein the transparent substrate is made of soft glass, hard glass, quartz glass, transparent ceramics or plastics.

In accordance with another aspect of the present invention, a LED light emitting strip with LED chips emitting 4π light is provided, wherein the LED light emitting strip comprises a transparent substrate and at least one series of LED chips on the transparent substrate connected in series in such a manner that the PN junctions therein have a same direction, the LED chips having transparent chip substrates, electrodes of the LED chips being led by an electrode leading device of the LED chips disposed at two ends of the transparent substrate, wherein a part of the LED chips are blue-light LED chips, while the other part of those are red-light LED chips, a luminescent phosphor powder layer is disposed around the LED chips and the transparent substrate on which the LED chips are installed to convert a part of blue light emitted from the LED chips into yellow light, while the other part of blue light is mixed with the yellow light and the red light to create white light, white light having high color rending index or other colored light.

In accordance with another aspect of the present invention, a LED light emitting strip with LED chips emitting 4π light is provided, wherein the LED light emitting strip comprises a transparent substrate and at least one series of LED chips on the transparent substrate connected in series in such a manner that the PN junctions therein have a same direction, the LED chips having transparent chip substrates, electrodes of the LED chips being led by an electrode leading device of the LED chips disposed at two ends of the transparent substrate, wherein a transparent tube or a transparent luminescent phosphor powder tube is enclosed at the outermost side of the LED chips and the transparent substrate.

In accordance with another aspect of the present invention, a LED light emitting strip with LED chips emitting 4π light is provided, wherein the LED light emitting strip comprises a transparent substrate and at least one series of LED chips on the transparent substrate connected in series in such a manner that the PN junctions therein have a same direction, the LED chips having transparent chip substrates, electrodes of the LED chips being led by an electrode leading device of the LED chips disposed at two ends of the transparent substrate, wherein the LED chips are transparent high voltage LED chips, which each includes at least two LED PN junctions connected in series.

A highly efficient LED light bulb with LED chips emitting 4π light in the present invention includes a light-transmission bulb shell, a core column with a exhaust tube, a power lead and a bracket, at least one LED light emitting strip with LED chips emitting 4π light, a driver, an electrical connector, a bulb shell and a connecting member to connect to the electrical connector, the light-transmission bulb shell and the core column are vacuum sealed to form a vacuum sealed chamber, which is filled with a gas having a low coefficient of viscosity and a high coefficient of thermal conductivity; the bulb shell, the LED light emitting strip, the driver, the electrical connector and the connecting member are electrically connected with each other to form an entire lamp; the LED light emitting strip is fixed at the core column, electrodes of the LED light emitting strip being connected to the driver and the electrical connector via the power lead of the core column, finally being connected to the external power supply to switch on the external power supply, i.e., lighting the LED light emitting strip.

It can be known from the above that in the present embodiment, the LED light bulb transmitting light is vacuum sealed with the core column, so as to house therein the corresponding bracket and the LED light emitting strip fixed thereon. Moreover, the driver and the electrical connector are disposed outside of the vacuum sealed chamber.

The vacuum sealed chamber formed by the light-transmission bulb shell and the core column is filled with the gas having a low coefficient of viscosity and a high coefficient of thermal conductivity, for example, He, $H_2$, or a mixed gas of He and $H_2$. At a room temperature the gas has a gas pressure in the range of 50-1520 Torrs. It is known that any static gas is a good thermal insulator, and heat dissipation of the gas is mainly dependent on convection. That is, it is necessary to select a gas having a low coefficient of viscosity. Helium has the smallest coefficient of viscosity, which is only 116 µP (that of $H_2$ is 173 µP, that of air is 922 µP, and that of water is 8937 µP), among the gases, thereby easily forming an efficient convection of the heat dissipation. On the other hand, the LED light emitting strip has a small volume and is easier to form an efficient convection of the gas, thereby efficiently taking away heat generated when the LED light emitting strip is working, via the convection and heat conduction of the gas and through the bulb shell. In addition, the LED light emitting strip is protected by inert gas such as He or other gas having a low coefficient of viscosity, and vacuum sealed. Since the LED light emitting strip is entirely unaffected by water vapor etc. in the surrounding environment, the LED light emitting strip and the LED chips therein have a long life time.

The LED light emitting strip with the LED chips therein emitting $4\pi$ light includes a transparent substrate, and at least one series of LED chips on the transparent substrate connected in series in such a manner that PN junctions have a same direction. The LED chips have transparent chip substrates, and are fixed on the transparent substrate by transparent glue, such as silicon glue, modified resin or epoxy resin and the like. The LED chip emits $4\pi$ light, and has a high luminescent efficiency. LED electrodes are led by power leads at two ends of the transparent substrate.

The transparent substrate of the LED light emitting strip is made of glass, hard glass, quartz glass, transparent ceramics or plastics and the like. The power leads at two ends of the LED light emitting strip are fixed at both ends of the transparent substrate by high temperature glue, plastics, sliver slurry or low melting glass.

The at least one series of LED chips are separately fixed on the transparent substrate with each other. Respective chips can be arranged adjacent to each other, or can be spaced apart from a certain distance. For example, the distance between the chips is larger than 0.01 mm. The heat generated when LED is working, is dispersedly distributed and easy to be dissipated. LED has a small temperature increment and long service lifetime. Since light emitted from the LED is dispersedly distributed, glare of LED is reduced.

Chips connected in series which are installed on the transparent substrate, can be the LED chips with identical or different luminescent colors, for example, emitting identical blue light, ultraviolet or other monochromatic light. The chips can also be RGB three primary colors or multiple primary colors, so as to obtain white light or the different colored mixed light. When different numbers of LED(s) having the multiple luminescent colors are selected, it is possible to obtain white light having a high color rendering index.

A transparent dielectric layer having high light transmissivity and high refractive index, for example, silicon glue, plastics or epoxy resin, can be laid on a surface of the transparent substrate of the LED light emitting strip installed with chips and on the chips, thereby increasing outgoing efficiency of the light and protecting the LED chips and the electrical connection wires thereof.

When the LED chips emit blue light or ultraviolet light, and need luminescent phosphor powder to convert them into white light or other colored light, a uniform luminescent phosphor powder layer outside of the light emitting strip and the chips thereof is also needed.

The luminescent phosphor powder can be coated on outer surfaces around the transparent substrate and the chips.

The luminescent phosphor powder layer can be coated on outer surface around the transparent substrate of the lighting emitting strip and a surface thereof installed with the chips as well as the transparent dielectric layer on the chips.

A transparent dielectric layer can be firstly coated around the transparent substrate of the light emitting strip and the chips, and then a uniform luminescent phosphor powder layer is coated thereon.

A uniform luminescent phosphor powder layer can be firstly coated around the transparent substrate of the light emitting strip and the chips, and then a transparent dielectric layer is coated thereon.

The luminescent phosphor powder layer is made by mixing the luminescent powder and the transparent dielectric, which is high transmissive for light, high refractive and high heat conductive, for example, silicon glue, epoxy resin, plastics, transparent glue, transparent lacquer and organic macromolecular material and so on.

The luminescent phosphor powder and the transparent dielectric are beforehand mixed to produce a uniform luminescent film, which is then wrapped around the transparent substrate and the transparent dielectric layer on the chips.

The luminescent phosphor powder layer, which is made by mixing the luminescent phosphor powder with the transparent dielectric, can also be made as a transparent dielectric luminescent phosphor powder tube. The luminescent phosphor powder tube can be placed outside of the transparent substrate and the chips. The transparent dielectric can be for example silicon glue, epoxy resin, plastics and glass and so on.

The luminescent phosphor powder can also be coated on an inner or outer wall of a glass tube, and made as a glass luminescent phosphor powder tube. And then the transparent substrate installed with at least one series of LED chips can be placed within the glass luminescent phosphor powder tube.

A dielectric having high transmissivity for light, high coefficient thermal conductivity and high refractive index, for example, silicon glue, epoxy resin, plastics and so on, can be filled between the transparent dielectric luminescent phosphor powder tube or the glass luminescent phosphor powder tube and the LED chips and the transparent substrate. Two ends of the above transparent dielectric luminescent phosphor powder tube or the glass luminescent powder tube can be fixed or sealed with the power lead at both ends of the transparent substrate.

The luminescent phosphor powder can also be coated on the inner wall of the transparent bulb shell.

The LED light emitting strip with LED chips therein emitting $4\pi$ light, has at least one series of LED chips connected in series, which can be high voltage LED chips. Each of the high voltage LED chips includes at least two LED PN junctions connected in series, any two of which therebetween have at least one electrical connection wire. At least one metal electrode for welding and bonding wire is provided at two ends of each high voltage LED chips. At least one electrical connection wire is provided between any two high voltage LED chips, and between the high voltage LED chip and a power lead of the high voltage LED. Since each high voltage LED chip has a plurality of LED PN junctions, the number of the chips needed by the light emitting strip is significantly reduced, thereby simplifying the process of die bonding and wire bonding of the light emitting strip, and improving the yield of produced light emitting strip. Meanwhile, it is not necessary for the LED PN junctions to have a large area of an opaque metal welding disk, and thus the outgoing efficiency of the light is improved, i.e., increasing the light emitting efficiency.

The above described various LED light emitting strips with LED chips therein emitting 4π light, can not only be used to manufacture the present LED light bulb, can but also be used as an individual light emitting element.

The at least one series of LED chips connected in series in such a manner that the PN junctions have a same direction, have sufficient numbers that a total driving voltage of the at least one LED light emitting strip used after being connected in series or in series-parallel, is close to an externally commercial AC voltage or a voltage of an external DC power supply, for example, 20-100% of a peak value of the voltage of AC used or the DC power supply. Therefore, the transformer is not necessary for the driver, and thus the present invention provides a simple circuit, a high efficiency, and a low cost.

The at least one LED light emitting strip having the LED chips therein emitting 4π light, is connected in series or in series-parallel connected, so that they can operate in the bidirectional AC mode or unidirectional DC mode.

The arrangement of the at least one light emitting strip is in a form of V, W, column, cone, or plane, et al.

In order to avoid the generation of shadow on the bulb shell caused by blocking light emitted from one LED light emitting strip by means of another LED light emitting strip, respective ones of the at least one light emitting strip interlace with each other. That is, any two strips of the various LED light emitting strips are not located in a same plane.

The various strips of the LED light emitting strips interlace with each other, at the diagonal line of respective faces of a virtual polyhedral column or polyhedral truncated cone.

When the at least one LED light emitting strip(s) is connected for operating in the bidirectional AC mode, at least one of the LED light emitting strips is conducted in a forward direction, while at least further one of the LED light emitting strips is conducted in a reverse direction. Alternative forward and reverse conversion of AC in direction makes the strips in turn to be conducted, thereby emitting light. Of course, at least 5 LED light emitting strips are disposed to form a circuit similar to the bridge rectifier circuit. Just like the available ACLED, alternative forward and reverse conversion of AC in direction makes the strips in turn to be conducted to emit light. The light emitting strip is sealed in the vacuum sealed light-transmission bulb shell, and the high working voltage is also isolated by or within the bulb shell. Thereby, it is possible to directly use the commercial AC. Of course, it is also possible to only connect in series a voltage reduction, current limiting or regulating circuit with the resistor and the capacitor being connected in parallel, or PTC resistor, et al. Therefore, the LED light emitting strip is safe and reliable, overcoming the defects of easily bearing high voltage and being unsafe as the heat sink of the current ACLED and HVLED.

When the at least one LED light emitting strip is connected for operating in the unidirectional DC mode, it can work with an external DC power supply or AC power supply. When using the external AC power supply, the diver can be composed of a rectifier and filter circuit and a step-down current-limiting circuit having a capacitor and a resistor connected in parallel or can use a rectifier and filter circuit or a rectifier circuit connected in series with a PTC resistor. The driver has a simple circuit, a low cost, no triodes, no transformers, no high frequency radiation and/or no electrolytic capacitors.

The driver can be a relatively simple non-isolated driver with an inductance and a constant-current source, without a transformer.

The light-transmission bulb shell is transparent, or is creamy, frosted or colored, or a part of the bulb shell has a reflective layer or a series of small prisms or lens.

The light-transmission bulb shell has a shape of any one of A, G, R, PAR, T, candle, P, PS, BR, ER, or BRL types of current light bulb shell.

The electrical connector is any one of the electrical connectors of E40, E27, E26, E14, GU, BX, BA, EP, EX, GY, GX, GR, GZ, and G types of the current light bulb.

As compared with the prior art, the present invention has the following advantageous:

A high luminescent efficiency. The gas having a low coefficient of viscosity, which is sealed within the vacuum sealed bulb, is used to perform the convective heat dissipation, thereby solving the heat dissipation problem of the LED chips emitting 4π light. When the chips emit 4π light, the luminescent efficiency is increased by up to above 65%. When utilizing the high voltage LED light emitting strip with a plurality of LED chips being connected in series, the efficiency of the driver circuit is up to above 95%. The efficiency of the entire lamp can be up to above 130 lm/W, which is one time the current LED light bulb, two times the energy-saving fluorescents lamp, and ten times the incandescent lamp. If the high voltage LED chips with the LED chips emitting 4π light are used, the luminescent efficiency will be further improved.

A low cost. The heat generated by the LED when it works is taken away via the convection and conduction of gas having a low coefficient of viscosity and a high coefficient of heat conduction within the vacuum sealed bulb shell and through the bulb shell, without needing the metal heat sink. When using the high voltage LED light emitting strip, it does not need a high cost AC/DC converter with a transformer. The cost of the entire lamp is reduced by two third or above. If the high voltage LED chips with the LED chips emitting 4π light are used, then the cost thereof can be further reduced.

A long lifetime. The entire light does not comprise any element devices in short lifetime. Since the LED is located within a vacuum sealed bulb shell filled with He inert gas, it is entirely unaffected by the water vapor etc. within the surrounding environment. In addition, the chips are dispersedly installed and work in a small current and at a low temperature. The service lifetime of the LED light bulb can be achieved to a long lifetime of the LED itself, i.e., 50,000-100,000 hours.

Safety and reliability. The high voltage LED light emitting strips with the high working voltage therefor are sealed in the vacuum sealed bulb shell. Therefore, they are safe and reliable, solving the safety problems of the current ACLED and HVLED.

Low weight and small volume. Since the LED entire light does not need the metal heat sink and the transformer, the weight of the light is reduced two third or above. The LED light in the present invention is lighter than the energy-saving fluorescent lamp, and its weight is close to that of the incandescent lamp. The volume of the present LED light is also close to that of the incandescent lamp.

Weak glare. A plurality of small current LED chips are dispersedly distributed, reducing the glare of the LED chips.

As the internal quantum efficiency of LED chips is further improved, and the price of the chips is continually decreased, the LED light bulb with LED chips emitting $4\pi$ light of the present invention may become a primary form of the LED general lighting lamp.

The present LED light bulb can directly replace the incandescent lamp and the energy-saving fluorescent light, for the purpose of lighting.

BRIEF DESCRIPTION OF THE DRAWING

Those and/or other aspect and advantages can be apparent and readily understood from the following description of the preferred embodiment, in combination with the accompanying drawings, wherein:

FIG. 6 is a schematic structure front view of LED light emitting strip in the highly efficient LED light bulb with LED chips emitting $4\pi$ light in accordance with one embodiment of the present invention;

FIG. 7 is a schematic structure view of the light emitting strip taken along a line A-A of FIG. 6 in accordance with one embodiment of the present invention;

FIG. 8 is a schematic structure view of the light emitting strip taken along a line A-A of FIG. 6 in accordance with another embodiment of the present invention;

Figure 1:
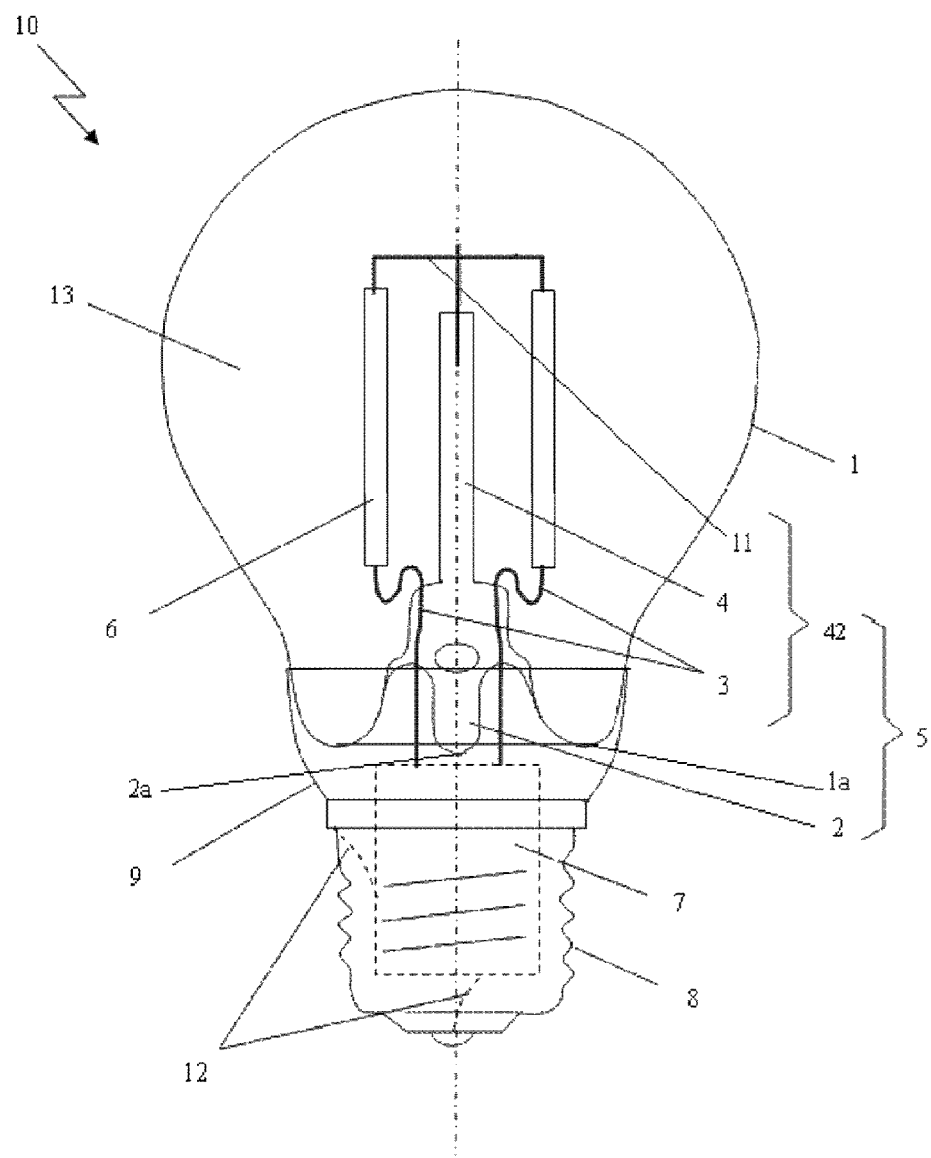
FIG. 1 is a schematic structure view of highly efficient LED light bulb with LED chips emitting $4\pi$ light in accordance with one embodiment of the present invention.

Brief explanation is below made to the reference numbers used in the accompanying drawing.

1. light-transmission bulb shell of LED light
1a. flared tube of core column
2. exhaust tube
2a. sealing site of exhaust tube
3. electrical power lead
3a. curved electrical power lead
4. pillar
42. bracket
5. core column
6, 6a, 6b. LED light emitting strip
7. driver
8. electrical connector
9. connecting piece
10. LED light bulb
11, 11a. metal wire on core column
12. electrical connection wire
13. vacuum sealed chamber
14. light reflecting layer
14a. light reflecting plate
15. transparent substrate
16, 16a. LED chip
17. electrical connection wire between chips
18. electrode lead;
19. fixing means for electrical power lead
20. welding end of electrical power lead
21. electrical connection wire
22. transparent glue
23. outgoing light
24. PN junction
25, 25a transparent dielectric layer
26, 26a luminescent phosphor powder layer
27. light emitting strip with transparent tube or luminescent phosphor powder tube
28. transparent tube or luminescent phosphor powder tube
29. electrical power lead
30. sealing site
31. transparent dielectric
32. luminescent phosphor powder layer
33. light emitting strip of high voltage LED chip
34. high voltage LED chip
35. LED PN junction
36. electrical connection wire between PN junctions
37. bonding disk on two ends of high voltage LED chip
38. electrical connection wire between high voltage LED chip and/or electrical connection wire between high voltage LED chip and power lead 39. cone axis
40. different colored LED light emitting strip
41. virtual polyhedron

DETAILED DESCRIPTION OF THE EMBODIMENTS OF THE INVENTION

The technical solution of the present invention will be further explained in detail, by the following embodiments, with reference to FIGS. 1-21. Throughout the specification, the same or similar reference numerals will indicate the same or similar components. The explanation to the implementing of the present invention with reference to the accompanying drawing is intended to interpret the general inventive concept of the present invention, instead of limiting the present invention.

With referring to FIG. 1, it is a schematic structure view of highly efficient LED light bulb with LED chips emitting 4π light in accordance with one embodiment of the present invention. This LED light bulb includes a light-transmission bulb shell 1 of LED light, a core column 5 with an exhaust tube 2 and a bracket, at least one LED light emitting strip 6 having a LED chip emitting 4π light, a driver 7, an electrical connector 8, a connecting piece 9 connecting the bulb shell 1 to the electrical connector 8. The light-transmission LED light bulb shell 1, the core column 5, the LED light emitting strip 6, the driver 7, the electrical connector 8 and the connecting piece 9 are connected with each other and as an integral LED light bulb 10. The LED light emitting strip 6 is affixed on the core column 5 by an electrical power lead 3 and a metal wire 11. Electrodes of the LED light emitting strip 6 are in turn connected to the driver 7, an electrical connection wire 12 (if required), the electrical connector 8 and an external power supply via the electrical power lead 3 and/or the metal wire 11 of the core column 5. When the external power supply is switched on, the LED light emitting strip 6 is lit. The light-transmission bulb shell of LED light 1 and the core column 5 constitute a vacuum sealed chamber 13 by means of vacuum sealing. The chamber 13 therein is filled with a gas having a low coefficient of viscosity and a high coefficient of thermal conductivity, which can take away heat generated by the LED light emitting strip 6 when the LED light emitting strip 6 is operating, via convection and conduction of the gas and through the light-transmission LED light bulb shell 1.

It should be understood that as shown in FIG. 1 a pillar 4, the power lead 3 and the metal wire 11 are used as a bracket 42 for fixing the LED light emitting strip 6. In the present embodiment, the core column 5 includes the exhaust tube 2, the flared pipe 1a, and the bracket 42 (which includes the power lead 3, the pillar 4 and the metal wire 11) integrated with each other. As described above, the core column 5 is vacuum sealed with the LED light bulb shell 1. Specifically, the flared pipe 1a is vacuum sealed with the LED light bulb shell 1 at the joined site thereof. As understood by the person skilled in the art, the core column of the present embodiment is arranged in the same way as various components of the prior art core column, therefore the detailed description to the core column are omitted.

Specifically, the LED light bulb shell 1 and the core column 5 are fused at the joined positions by high temperature heating process, thereby forming a vacuum sealed chamber 13. The process used in the present embodiment is identical to the sealing process used in traditional incandescent lamps. The LED light emitting strip 6, the pillar 4 of the core column 5, and the metal wire/connection wire 11 between one end of the electrical power lead 3 and the light emitting strip 6 are altogether sealed in the vacuum sealed chamber 13; the vacuum sealed chamber 13 is filled with a gas having a low viscosity coefficient and a high thermal conductivity coefficient after being vacuumized via the exhaust tube 2; and then the exhaust tube 2 is fused at the sealed site 2a to seal the gas within the chamber 13. The gas having a low viscosity coefficient and a high thermal conductivity coefficient within the vacuum sealed chamber 13, is for example, He, $H_2$, or a mixed gas of He and $H_2$, a pressure of which is in the range of 50-1520 Torrs, at room temperature. Helium has the smallest viscosity coefficient among various gases, which is only 116 μP (as compared, that of $H_2$ is 173 μP, that of air is 922 μP, that of water is 8937 μP). Therefore, Helium is easy to perform efficient convection dissipation, so as to take away heat generated by the LED light emitting strip when it is operating, to ensure the normal operation of the LED light emitting strip.

As can be seen from above, the vacuum sealed chamber 13 only includes the LED light emitting strip 6, the pillar 4 of the core column 5, and the metal wire/connecting wire 11 between one end of the power cord 3 and the light emitting strip 6. The electrodes at two ends of the LED light emitting strip 6 are in turn electrically connected to the driver 7, the electrical connection wire 12 and the electrical connector 8 outside of the vacuum sealed chamber 13 via the power lead 3 on the core column 5. The electrical connector 8 is used to connect the external power supply, so as to light the LED light emitting strip 6.

The LED light emitting strip 6 is protected by inert gases such as He or other gas having low viscosity coefficient, and vacuum sealed, thereby being entirely unaffected by for example the water vapor etc. within the surrounding environment. This will prolong the life time of the LED.

The LED light emitting strip 6 has at least one series of PN junctions which are connected in series with each other in such a manner that PN junctions have a same direction. The number of the LED chip is sufficiently large such that an overall driving voltage of the at least one LED light emitting strip used after being connected in series or in series-parallel is close to the external alternating voltage or a voltage of the external DC power supply, for example, in the range of 20-100% of a peak value of the used AC voltage or the voltage of the DC power supply. Thereby, as for the resulting high voltage LED light emitting strip with the LED chip emitting 4π light, there are the following advantages: the driver does not need the transformer, the circuit is simplified, efficiency is improved and cost becomes low.

The at least one LED light emitting strip 6 may be connected in series or in series-parallel, so that they can operate in the bidirectional AC mode or the unidirectional DC mode. FIG. 1 shows an example in which two LED light emitting strips are connected in series so as to operate in the unidirectional DC mode.

When the at least one LED light emitting strip 6 is connected for operating in the unidirectional DC mode, the external power supply thereof can be a DC power supply or an AC power supply. When using the external AC power supply, the diver 7 can be composed of a step-down current-limiting circuit having a capacitor and a resistor connected in parallel and a rectifier and filter circuit, or can use a rectifier and filter circuit or a rectifier circuit in series connected with a PTC resistor without triode, transformer, and/or electrolytic capacitor, or can employ a constant-current device without switching power supply and a transformer. Therefore, the driver has a low cost.

When the at least one LED light emitting strip(s) 6 is(are) connected for operating in bidirectional AC mode, at least one of the LED light emitting strips is conducted in forward direction, while at least further one of the LED light emitting strips 6 is conducted in reverse direction. Alternative forward and reverse conversion of AC in direction makes the strips in turn to be alternatively conducted to emit light. Of course, it is also possible that at least 5 LED light emitting strips 6 are disposed to form a circuit similar to the bridge rectifier circuit. That is, 4 light emitting strips are in turn conducted by alternative forward and reverse conversion of AC on 4 arms, for emitting light, while a strip connected diagonally to the 4 arms is always conducted to emit light, whether AC is in the forward direction or in the reverse direction.

When the light emitting strips are operating in the bidirectional AC mode, they can directly work by the commercial AC, or the driver 7 is only the PTC resistors or the current-limiting resistors connected in series.

The LED light emitting strip having the LED chips emitting $4\pi$ light can be a high voltage LED light emitting strip, and the working environment with a high working voltage thereof is vacuum sealed in the LED light bulb shell which has been vacuum sealed. Therefore, the present high voltage LED light emitting strip is safe and reliable.

The light-transmission bulb shell 1 is transparent, or is creamy, frosted, or colored. Of course, a part of the bulb shell can have a reflective layer or a series of small prisms or lens, as required.

The light-transmission bulb shell 1 can have a shape of A, G, R, PAR, T, S, candle, P, PS, BR, ER, BRL, or any other shape of the bulb shell of the current light bulb.

The electrical connector 8 can be any one of the electrical connectors of the current light bulbs such as E40, E27, E26, E14, GU, B22, BX, BA, EP, EX, GY, GX, GR, GZ, and G types, so as to adapt for fixing on different lamp holders or lighting fitting. FIG. 1 shows an example of the E type light head.

Please be noted that in the following embodiments of the present invention, the reference numerals identical to those used in the FIG. 1 indicate identical or functionally similar elements. For the sake of convenience, they are not again described in the following embodiments, unless they bear different structure or function.

Figure 2:
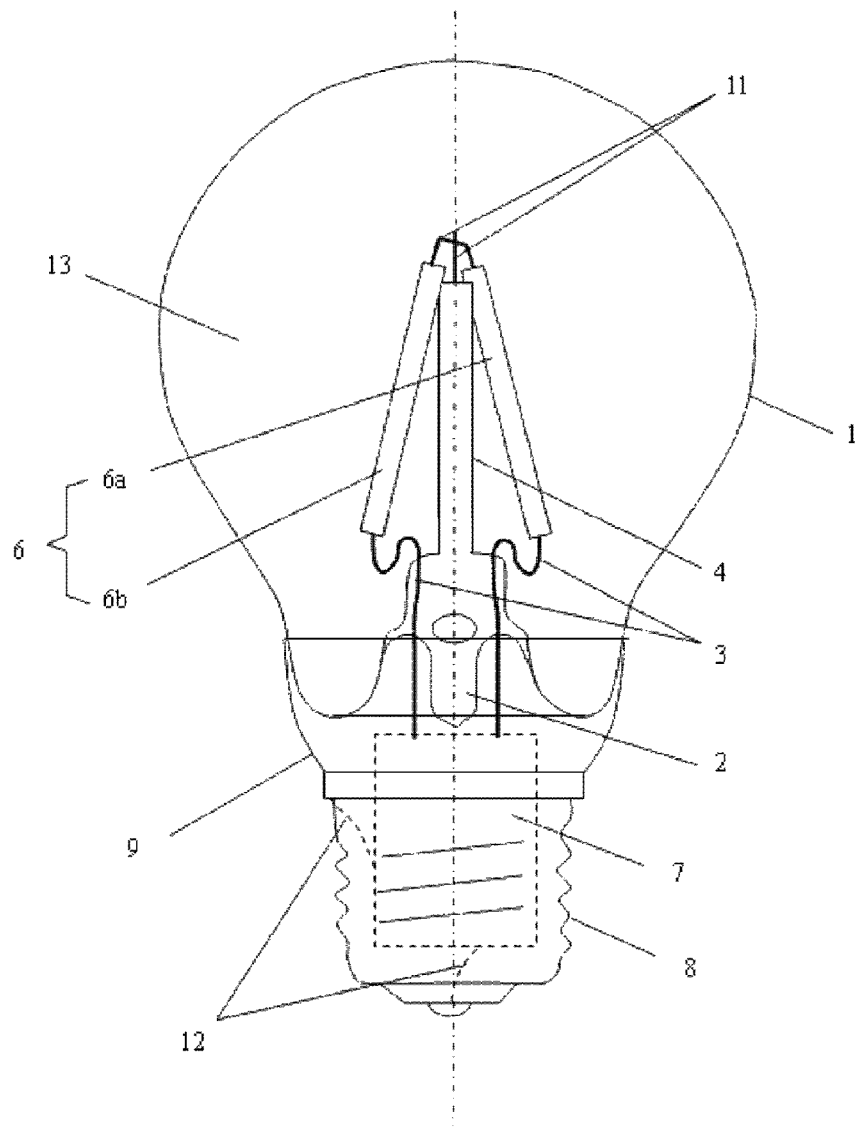
FIG. 2 is a schematic structure view of highly efficient LED light bulb with LED chips emitting $4\pi$ light in accordance with another embodiment of the present invention.

FIG. 2 is a schematic structure view of highly efficient LED light bulb having the LED chips emitting $4\pi$ light in accordance with another embodiment of the present invention. In FIG. 2, in order to avoid the generation of shadow on the LED light bulb shell 1 (hereinafter called as the bulb shell 1) or on the lighting fitting caused by blocking light emitted from one LED light emitting strip by means of another LED light emitting strip, various LED light emitting strips interlace with each other. That is, any two strips of the various LED light emitting strips are not located in a same plane. In the present embodiment, the LED light emitting strips 6 have two LED light emitting strips 6a and 6b, the lower ends (adjacent to an end of the exhaust tube 2) of which are located at the same horizontal plane (or at the same height level) of FIG. 2, while the upper ends thereof are installed front and back.

Figure 3:
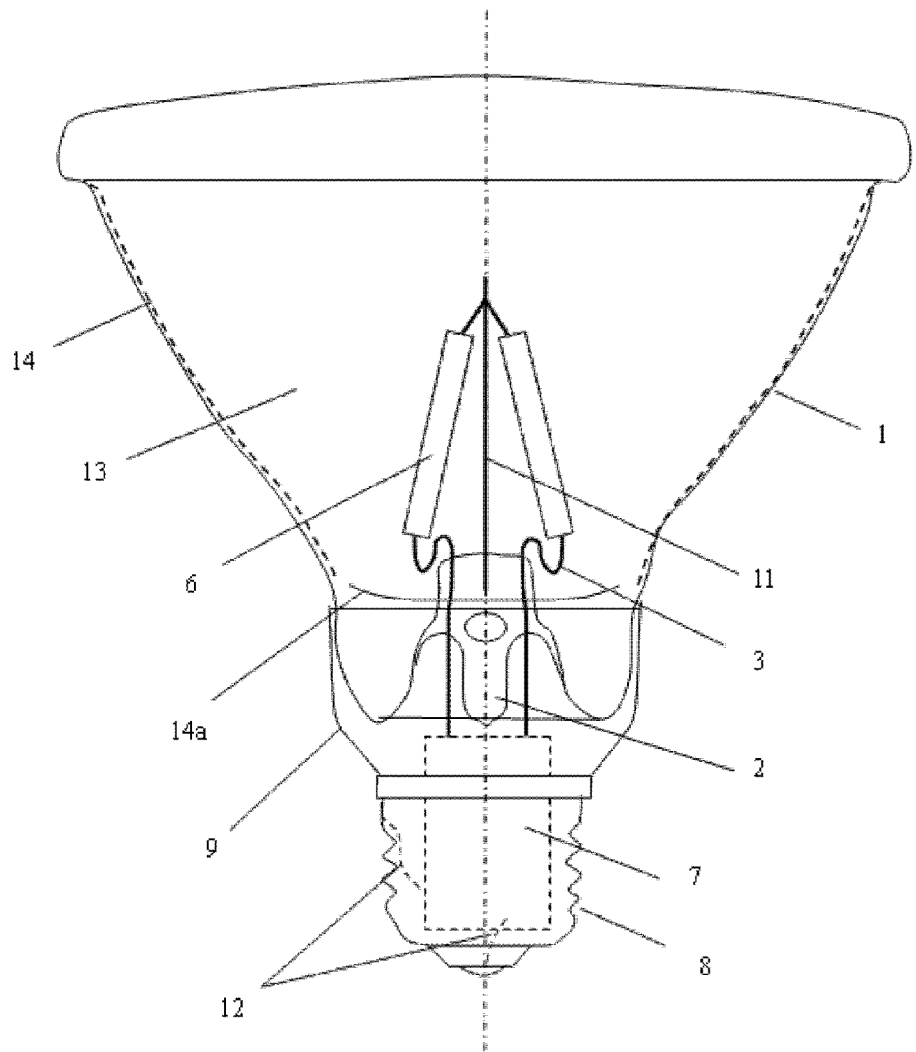
FIG. 3 is a schematic structure view of highly efficient LED light bulb with LED chips emitting $4\pi$ light in accordance with a further embodiment of the present invention.

FIG. 3 is a schematic structure view of highly efficient LED light bulb with LED chips emitting $4\pi$ light in accordance with a further embodiment of the present invention. Specifically, the bulb shell 1 is PAR shaped, the bulb shell 1 has a light reflecting layer 14 on an inner wall thereof, and the LED light emitting strip 6 is fixed to the metal wire 11 of the core column 5 and the electrical power lead 3. In order to improve the luminescent efficiency, a light reflecting plate 14a is provided at the bottom of the bulb shell 1, in order to forwardly reflect the light of the LED light emitting strip 6 being directed toward the bottom to improve the luminescent efficiency.

Figure 4:
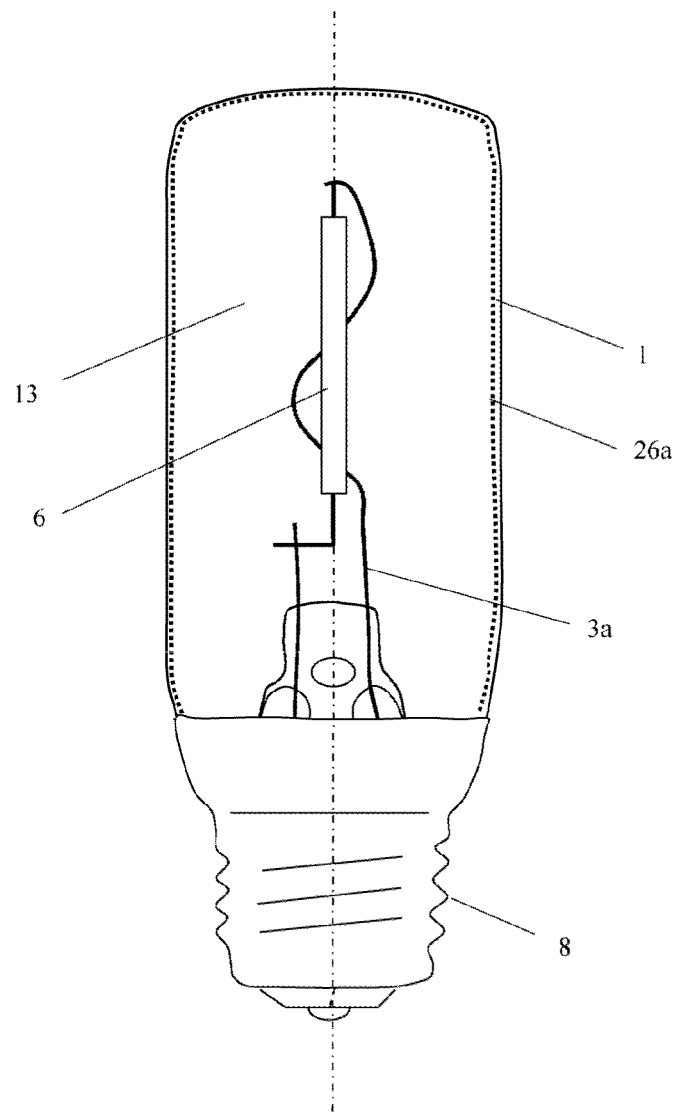
FIG. 4 is a schematic structure view of highly efficient LED light bulb with LED chips emitting $4\pi$ light in accordance with a yet further embodiment of the present invention.

FIG. 4 is a schematic structure view of highly efficient LED light bulb with LED chips emitting $4\pi$ light in accordance with a yet further embodiment of the present invention. The bulb shell 1 is T shaped, and at least one the LED light emitting strip 6 is directly fixed to the power lead 3 and 3a of the core column 5. The power lead 3a connected to the upper end of the LED light emitting strip 6 is curved, so as to prevent the light emitted from the LED light emitting strip 6 from generating shadow on the bulb shell 1 via the power lead in parallel to it. The bulb shell 1 is provided with a luminescent powder layer 26a on the inner wall thereof, while the LED light emitting strip does not have the luminescent powder layer. The electrical connector 8 is directly connected with the bulb shell 1. It is necessary to note in this example that the power lead 3a can be considered as a curve bracket for the LED light emitting strip 6.

Figure 5:
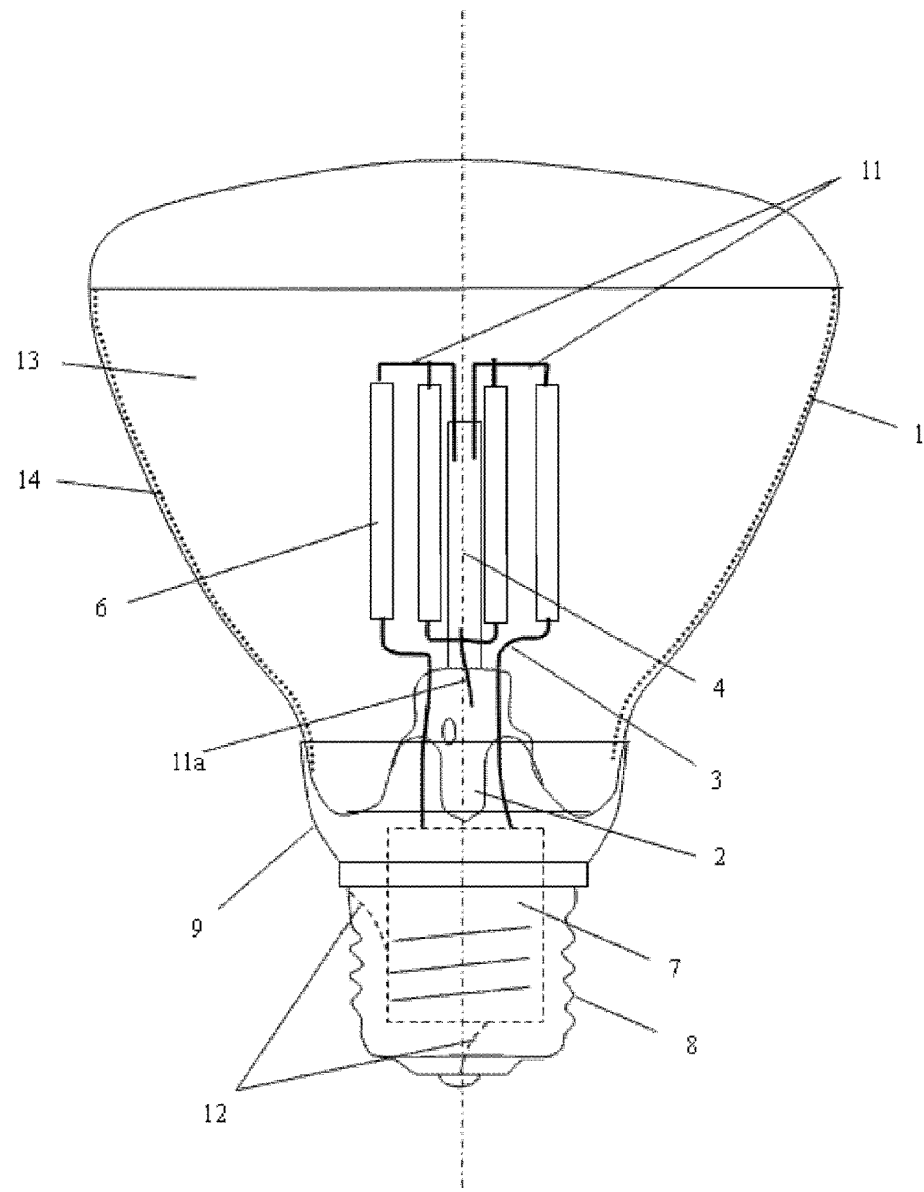
FIG. 5 is a schematic structure view of highly efficient LED light bulb with LED chips emitting $4\pi$ light in accordance with a still further embodiment of the present invention.

FIG. 5 is a schematic structure view of highly efficient LED light bulb with LED chips emitting $4\pi$ light in accordance with a still further embodiment of the present invention. In this example, the bulb shell 1 is R-type reflective bulb shell, and a light reflecting layer 14 is provided on the inner wall of the bulb shell 1. 4 LED light emitting strips 6, connected in series each other, are attached and fixed to the core column 5 by the power lead 3, the metal wire 11a of the core column and the metal wire 11 of the pillar 4.

FIG. 6 is a schematic structure front view of LED light emitting strip 6 in the highly efficient LED light bulb with LED chips emitting $4\pi$ light in accordance with one embodiment of the present invention. The LED light emitting strip 6 includes a transparent substrate 15, on which at least one series of LED chips 16 are provided. The at least one series of LED chips 16 are in series connected in such a manner that PN junctions have a same direction. An electrical connection wire 17 is provided between the LED chips 16. At two ends of the transparent substrate 15 are respectively the LED electrode leads 18 and a fixing means 19. One end 20 of the electrode lead 18 facing toward the LED chips 16 is exposed, to electrically connect the connecting wire 21 and the LED chips 16.

The transparent substrate 15 is made of glass, hard glass, quartz glass, transparent ceramics or plastics and so on. The fixing means 19, for the electrode lead 18 at two ends of the LED light emitting strip 6, is made of high-temperature glue, plastic, silver slurry or low melting glass. Since the present LED light bulb employs a vacuum sealed chamber formed by vacuum sealing the LED light bulb shell with the core column and the vacuum sealed chamber is filled with a gas having a low coefficient of viscosity and a high coefficient of thermal conductivity to perform fast heat dissipation, unlike the LED light emitting strip in the prior art, the present invention is not limited to only use of the very expensive transparent substrate such as sapphire, diamond to withstand the high temperature generated by the LED light emitting strips. Thereby, the transparent substrate of the present LED light emitting strips 6 can be made by relatively cheap materials such as glass, hard glass, quartz glass, transparent ceramics or plastics, reducing the fabrication cost of the LED light emitting strips 6.

The chips 16 connected in series which are installed on the transparent substrate 15, can be the identical or different luminescent colored LED chips, for example, emitting identical blue light, ultraviolet or other monochromatic light. It is also possible to emit different colored light, so as to obtain the different colored mixed light or white light. When a different number of LED(s) having the different luminescent color is selected, it is possible to obtain a high color rendering index white light having different color temperatures.

FIG. 7 is a schematic sectional structure view of the LED light emitting strip 6 taken along a line A-A of FIG. 6. As shown in FIG. 7, the LED chips 16 are fixed on the transparent substrate 15 by transparent glue 22. The chip substrates of the LED chips 16 are transparent. Light is emitted from the PN junctions 24 of the LED chip 16. A part of emitted light can directly outgo toward a direction of the electrical connection wire 17, and another part of the emitted light (i.e., the light reflected toward the transparent substrate 15 by total reflecting and the light directed originally toward the transparent substrate 15) can outgo via the chip substrate and the transparent substrate 15 of the light emitting strip. As shown in FIG. 7, it can be known from the outgoing light 23 that the LED chips 16 are capable of emitting $4\pi$ light, thereby significantly reducing loss of the light emitted from the PN junctions caused by reflection, multiple reflections and absorption within the LED chips 16, finally greatly improving the luminescent efficiency of the LED chips and the external quantum efficiency. That is, the light emitting efficiency of the LED chips is improved. The transparent glue 22 is, for example, epoxy resin, modified resin or silica gel, and so on.

FIG. 8 is a schematic sectional structure view of the LED light emitting strip 6 taken along a line A-A of FIG. 6 in accordance with another embodiment of the present invention. In this embodiment, a transparent dielectric layer 25 having high refractive index, high light transmissivity and high thermal conductivity is disposed on LED chips 16 and a surface of the transparent substrate 15 installed with the LED chips 16, for increasing the light transmissivity of the LED chips 16 in a direction of the connecting wire 17 and protecting the chips 16 and the electrical connection wire 17 thereof. The transparent dielectric is silica gel, epoxy resin and plastics, for example.

When LED chips emit blue light or ultra violet light and luminescent powder is needed to convert the light into white light or other luminescent color, the LED light emitting strips 6 as shown in FIGS. 6, 7 and 8 further need a luminescent powder layer at the outside thereof. The luminescent powder layer can be closely attached to a surface of the LED light emitting strip 6, or coated onto an inner or outer wall of the transparent dielectric tube outside of the LED light emitting strip 6. Of course, the luminescent powder can be mixed into the wall of the transparent dielectric tube (for example, to be made as a luminescent powder tube), or be coated on the inner wall of the bulb shell 1, as shown as the phosphor powder layer 26a in FIG. 4.

Figure 9:
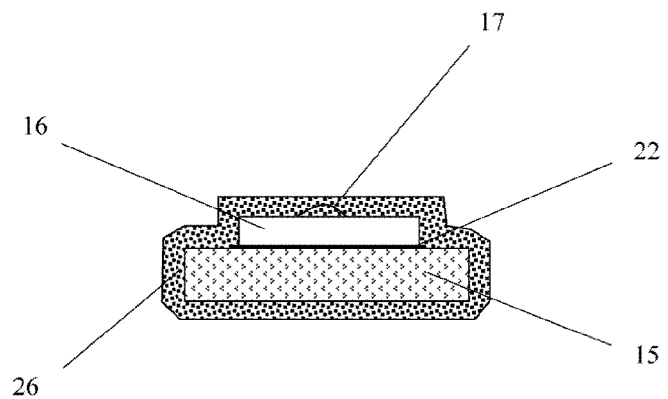
FIG. 9 is a schematic structure view of the light emitting strip taken along a line A-A of FIG. 6 in accordance with a further embodiment of the present invention.

FIG. 9 is a schematic sectional structure view of the LED light emitting strip having the luminescent powder layer in accordance with one embodiment. In this embodiment, a uniform luminescent powder layer 26 is coated on outer surfaces around the LED chips 16 and the transparent substrate 15. In other words, a uniform luminescent powder layer 26 is coated on the outer surfaces of the LED light emitting strips as shown in FIG. 7.

The luminescent powder layer 26 is made by mixing the luminescent powder and the transparent dielectric. The transparent dielectric is for example the silicon glue, epoxy resin, plastics, transparent glue, transparent lacquer, high molecular polymer or the like.

Figure 10:
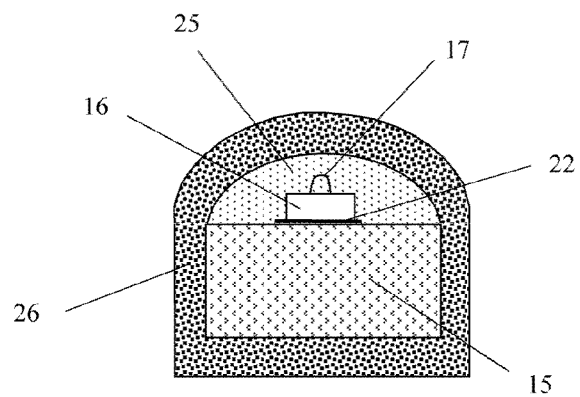
FIG. 10 is a schematic structure view of the light emitting strip taken along a line A-A of FIG. 6 in accordance with a yet further embodiment of the present invention.

FIG. 10 is a schematic sectional structure view of the LED light emitting strip having the luminescent powder layer in accordance with another embodiment. In FIG. 10, a transparent dielectric layer 25 is firstly coated on the LED chips 16 and a surface of the transparent substrate 15 installed with the chips (as shown in FIG. 8), and then a luminescent powder layer 26 is laid around the transparent substrate 15 and the transparent dielectric layer 25.

Figure 11:
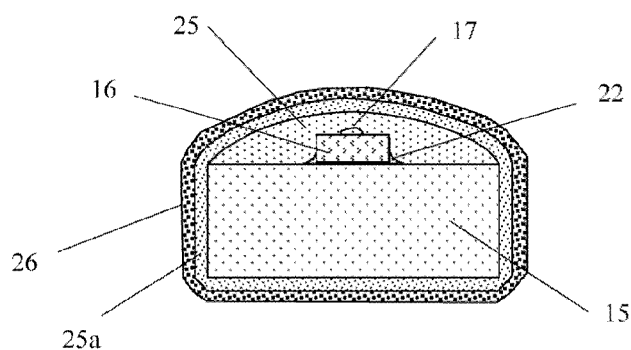
FIG. 11 is a schematic structure view of the light emitting strip taken along a line A-A of FIG. 6 in accordance with a still further embodiment of the present invention.

FIG. 11 is a schematic sectional structure view of the LED light emitting strip having the luminescent powder layer in accordance with another embodiment. In FIG. 11, a transparent dielectric layer 25a is firstly coated around the transparent substrate 15 and a transparent dielectric layer 25 on the surface thereof installed with the LED chips 16, and then a uniform luminescent powder layer 26 is laid around the transparent dielectric layer 25a.

Figure 12:
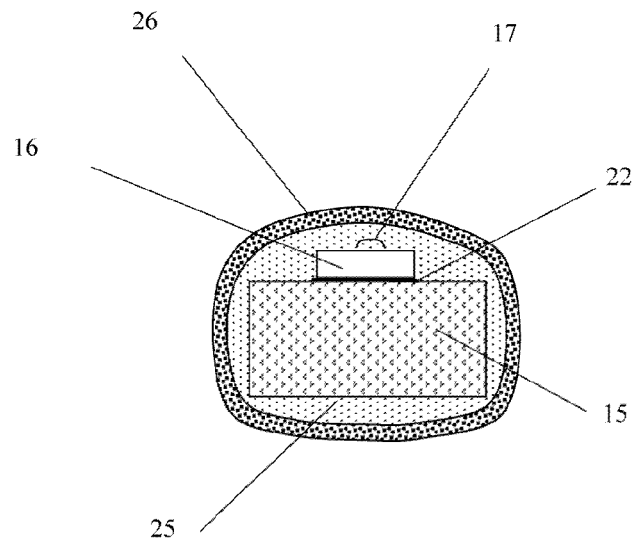
FIG. 12 is a schematic structure view of the light emitting strip taken along a line A-A of FIG. 6 in accordance with a further embodiment of the present invention.

FIG. 12 is a schematic sectional structure view of the LED light emitting strip having the luminescent powder layer in accordance with another embodiment. In FIG. 12, a transparent dielectric layer 25 is firstly coated around the chips 16 and the transparent substrate 15, and then a uniform luminescent powder layer 26 is laid around the transparent dielectric layer 25.

Figure 13:
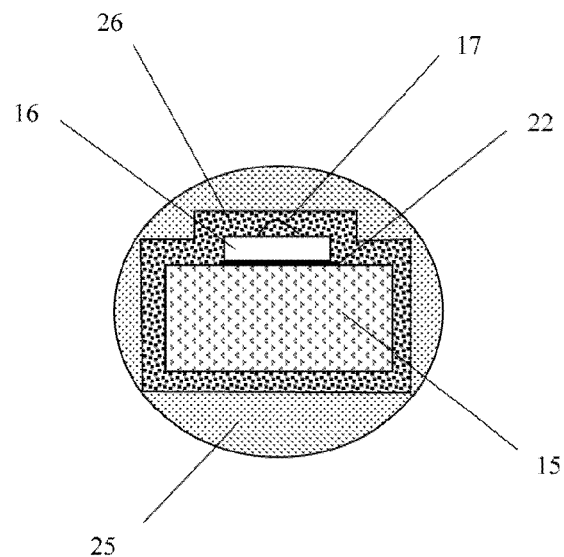
FIG. 13 is a schematic structure view of the light emitting strip taken along a line A-A of FIG. 6 in accordance with a further embodiment of the present invention.

FIG. 13 is a schematic sectional structure view of the LED light emitting strip having the luminescent powder layer in accordance with another embodiment. In FIG. 13, a uniform luminescent powder layer 26 is firstly coated around the chips 16 and the transparent substrate 15, and then a transparent dielectric layer 25 is laid around the luminescent powder layer 26.

Figure 14:
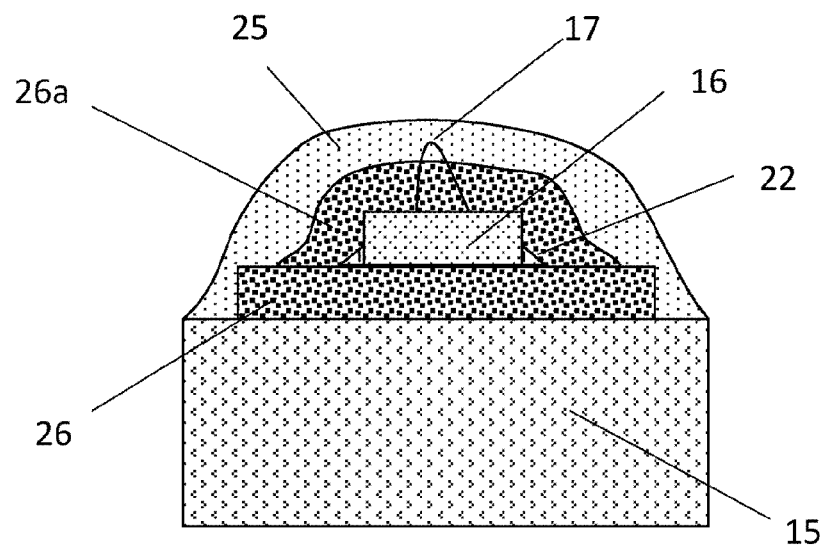
FIG. 14 is a schematic sectional structure view of the LED light emitting strip having the luminescent powder layer in accordance with another embodiment.

FIG. 14 is a schematic sectional structure view of the LED light emitting strip having the luminescent powder layer in accordance with another embodiment. In FIG. 14, a luminescent powder layer 26 is firstly coated on the transparent substrate 15, and then the chips 16 are fixed on the luminescent powder layer 26 by a glue 22 for chip attaching. Subsequently, electrodes of the respective chips are connected with each other by the connection wire 17, and another luminescent powder layer 26a is covered on the chips 16. Therefore, the chips 16 are wrapped around by the luminescent powder layers 26 and 26a. It can avoid the light emitted from the chips per se from leaking out from the sides and/or ends of the substrate 15, while saving the materials thereof and reducing the cost thereof. When the luminescent powder layer 26a is too thin to cover the connection wire 17 entirely, a further transparent dielectric layer 25 may be coated on the luminescent powder layer 26a.

Figure 15:
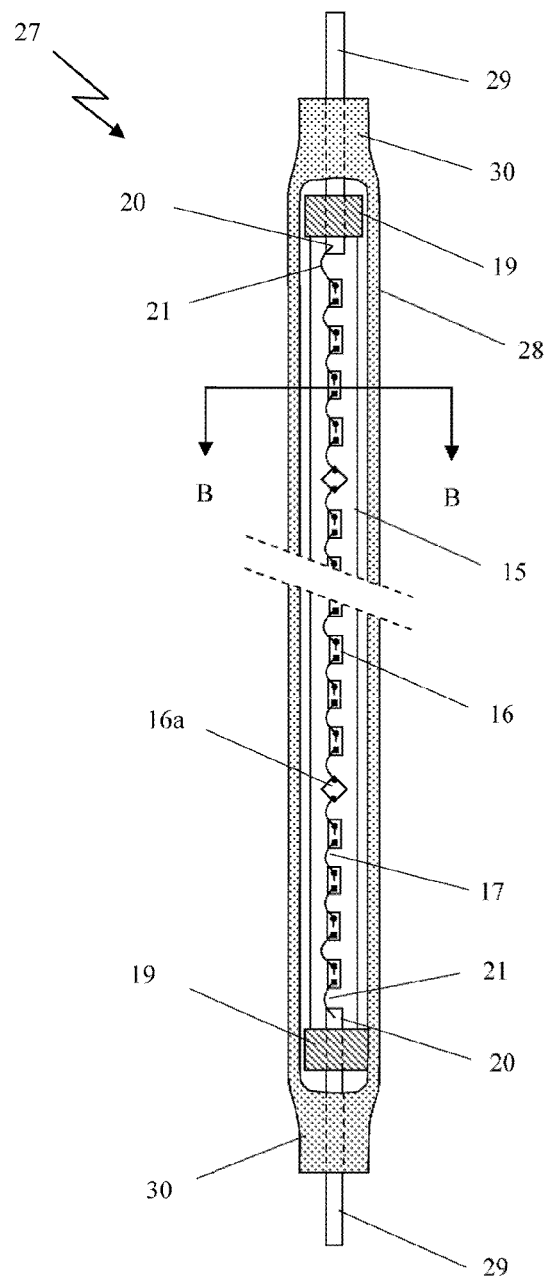
FIG. 15 is a schematic structure front view of LED light emitting strip in the highly efficient LED light bulb with LED chips emitting $4\pi$ light in accordance with one embodiment of the present invention.

In addition, a transparent tube can be further arranged at the outside of the LED light emitting strip 6 of FIG. 6, for protecting the LED chips. Of course, the LED light emitting strips 6 can further be provided with a luminescent powder layer. FIG. 15 is a schematic structure front view of the LED light emitting strip provided with a transparent outer tube in accordance with one embodiment. As shown in FIG. 15, the LED light emitting strip 27 includes a transparent outer tube 28, in which the transparent substrate 15 installed with the LED chips 16 is sealed. The electrodes of the LED chips 16 are led via the electrical power leads 29 at both ends of the transparent tube 28, and the electrical power lead 29 is sealed with the transparent tube 28 at the sealing site 30. In FIG. 15, the LED chips 16 can be LED chips having two different luminescent colors. For example, the LED chip 16 emits blue light, and the LED chip 16a emits red light. The LED chip 16a having different colors can be used to change the color temperature and the color rendering index of the emitted light.

Figure 16:
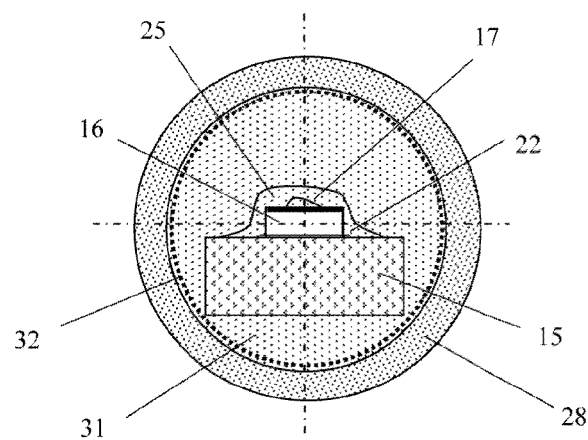
FIG. 16 is a schematic structure view of the light emitting strip taken along a line B-B of FIG. 15 in accordance with one embodiment of the present invention.

FIG. 16 is a schematic structure view of the LED light emitting strip 27 with LED chips emitting $4\pi$ light, taken along a line B-B of FIG. 15. In FIG. 16, the LED chips 16 and the transparent substrate 15 thereof are further provided with a transparent tube 28, which is made of such as glass, plastics or silicon glue. When the light emitting strip 27 needs a luminescent powder layer, the powder can be coated onto the inner or outer wall of the transparent tube 28. FIG. 16 shows an example in which the luminescent powder layer 32 is coated onto the inner wall of the transparent tube 28.

As shown in FIG. 16, the luminescent powder can also be mixed into the transparent dielectric of the transparent tube 28. That is, the luminescent powder is mixed with the transparent dielectric such as glass, plastics, or silicon glue, so as to produce the transparent luminescent powder tube. In this way, it is not necessary to again coat the luminescent powder layer 32 onto the inner or outer wall of the transparent tube 28.

As shown in FIG. 16, the materials 31 having a high coefficient of thermal conductivity, high refractive index and high light transmissivity can be filled between the transparent tube 28 and the LED chips as well as the transparent substrate 15, for example, the transparent silicon glue, epoxy resin and plastics, and the like. When the LED chips emit $4\pi$ light, the light loss of the emitted light from the LED chips becomes very little at various dielectric interfaces, since the glass substrate, the transparent glue and the glass tube have the refractive indexes close to each other, thereby achieving a high luminescent efficiency, i.e., a high light emitting efficiency of the LED chips.

Figure 17:
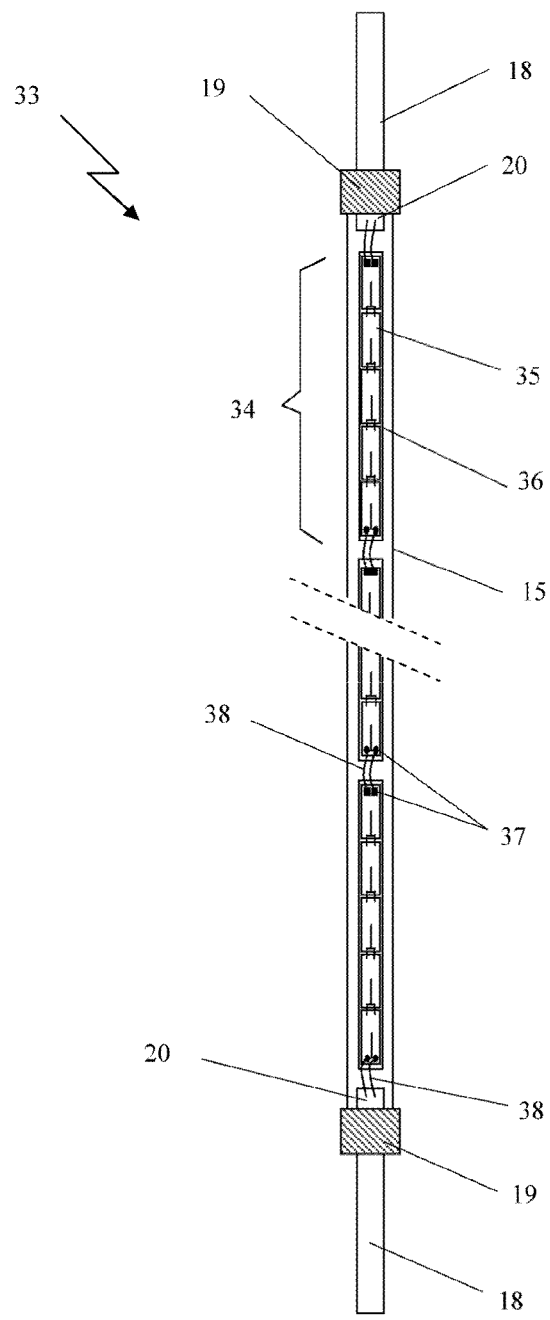
FIG. 17 is a schematic structure front view of LED light emitting strip with high voltage LED chips emitting $4\pi$ light in accordance with one embodiment of the present invention.

FIG. 17 is a schematic structure front view of LED light emitting strip with LED chips emitting $4\pi$ light in accordance with another embodiment of the present invention. As shown in FIG. 17, for the LED light emitting strip 33 with the LED chips emitting $4\pi$ light, the chip substrates of the LED chips are transparent. The LED chips are high voltage LED chips, and each of the high voltage LED chips 34 includes at least two LED PN junctions 35 connected in series. At least one electrical connection wire 36 is between the respective PN junctions, for making a connection. Both ends of each high voltage LED chip have at least one metal electrode 37 for welding and wire bonding, respectively. At least one electrical connecting wire 38 can be provided between the various high voltage LED chips, and between the high voltage LED chips and the power lead 18 of the high voltage LED light emitting strip.

As shown in FIG. 17, at least one high voltage LED chips 34 of the LED light emitting strip 33 can be of same or different luminescent color. The light emitting strip 33 can have a transparent dielectric layer on a surface of the chips, as those in FIGS. 6 and 15. Further, a luminescent powder layer can be disposed around the light emitting strip 33.

It should be understood that the above LED light emitting strips 6, 27 and 33 with the LED chips emitting $4\pi$ light can be used to produce the LED light bulb as shown in FIGS. 1-5, or can be individually used as a light emitting element.

Figure 18:
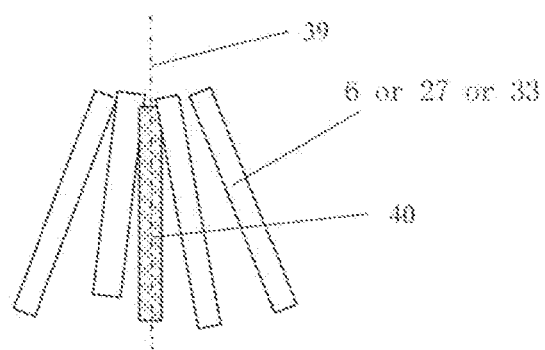
FIG. 18 is a schematic view of another arrangement of LED light emitting strips in the highly efficient LED light bulb with LED chips emitting $4\pi$ light in accordance with one embodiment of the present invention.
Figure 19:
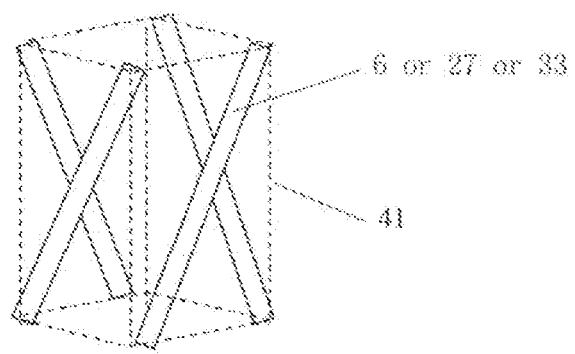
FIG. 19 is a schematic view of another arrangement of LED light emitting strips in the highly efficient LED light bulb with LED chips emitting $4\pi$ light in accordance with one embodiment of the present invention.
Figure 20:
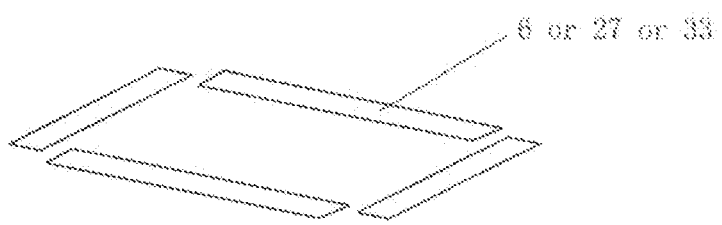
FIG. 20 is a schematic view of another arrangement of LED light emitting strips in the highly efficient LED light bulb with LED chips emitting $4\pi$ light in accordance with one embodiment of the present invention.
Figure 21:
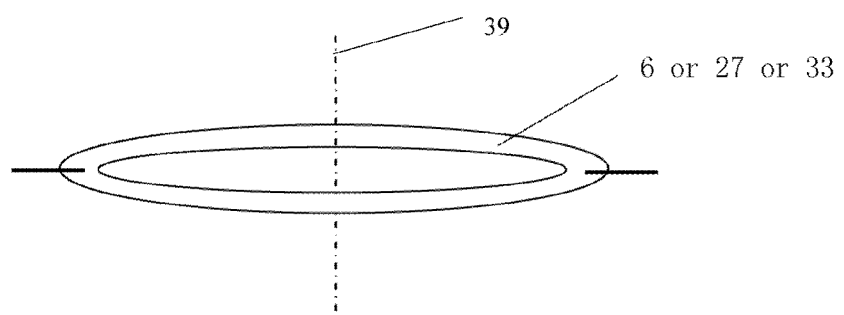
FIG. 21 is a schematic view of another arrangement of LED light emitting strips in the highly efficient LED light bulb with LED chips emitting $4\pi$ light in accordance with one embodiment of the present invention.

When being used to produce a LED light bulb, the positions of the at least one LED light emitting strips can be arranged as required, for example in the shape of column, V, W, cone and plane, and the like. For example, it can be arranged like as shown in FIGS. 1-5 or in FIGS. 18-21. When it is needed to avoid generating shadow on the bulb shell caused by blocking the light emitted from one LED light emitting strip by means of another LED light emitting strip, the various ones of the at least one LED light emitting strips should interlace with each other, as shown in FIG. 19. The LED light emitting strips are arranged at diagonal lines of various faces of a virtual polyhedral column or polyhedral truncated cone. In other words, the LED light emitting strips are as a whole provided in a physical form of the polyhedral column or polyhedral truncated cone, while neither of the LED light emitting strips is located in a same plane. FIG. 19 shows the square body arrangement of 4 LED light emitting strips, while they are respectively located on the diagonal lines of the four faces as shown by the dashed line 41 of FIG. 19.

The used light emitting strips 6, 27 and 33 can be of the identical or different luminescent colors, so as to form lights having different luminescent colors, different color temperatures and different color rendering indexes. For example, as shown in FIG. 18, the light emitting strips 6, 27 or 33 comprising four LED chips emitting blue light and being coated with a luminescent powder layer excited by blue light to generate yellow light, can be arranged around the cone axis 39 among them, as a cone shape. Meanwhile, there is another LED light emitting strip 40 emitting other colored light. The another LED light emitting strip 40 for example emits red light, to change the relative light flux of the both, i.e., to obtain the white light LED light bulb having different color temperature and color rending index.

Although some embodiments of the general inventive concept are illustrated and explained, it would be appreciated by those skilled in the art that modifications and variations may be made in these embodiments without departing from the principles and spirit of the general inventive concept of the disclosure, the scope of which is defined in the claims and equivalents thereof.

What the claims is:

1. A LED light bulb, comprising:
   a LED light bulb shell;
   a core column with an exhaust tube and a bracket;
   at least one LED light emitting strip with a plurality of LED chips mounted thereon in a manner that permits the LED light bulb to emit $4\pi$ light;
   a driver; and
   an electrical connector, wherein the LED light bulb shell is vacuum sealed with the core column so as to form a vacuum sealed chamber, which is filled with a gas having a low coefficient of viscosity and a high coefficient of thermal conductivity, wherein the bracket and the LED light emitting strips fixed on the bracket are housed in the vacuum sealed chamber,
   the LED light emitting strips being connected in series or in series and parallel, and arrangement of the LED light emitting strips is in the form of V, W, column, cone, or plane;
   each of the LED light emitting strips having one LED electrode lead wire at each of two ends, with a first end of each of the LED electrode lead wires connected to one of the plurality of LED chips of the LED light emitting strips by an electrical connection wire, while a second end of each of the LED electrode lead wires is connected to a LED electrode lead wire of another LED light emitting strip by a metal wire or to an electrical power lead of the LED light bulb,
   wherein the LED light emitting strips are supported within the LED light bulb by fixing the metal wires on a pillar of the core column.

2. The LED light bulb of claim 1, wherein the LED light bulb she is capable of transmitting light and connected to the electrical connector directly or by a connecting piece.

3. The LED light bulb of claim 1, wherein the gas having a low coefficient of viscosity and a high coefficient of thermal conductivity includes He, $H_2$, and a mixed gas of He and $H_2$, and at room temperature the gas has a gas pressure in the range of 50-1520 Torrs.

4. The LED light bulb of claim 1, wherein each of the at least one LED light emitting strips has at least one series of LED chips connected in series in such a manner that the PN junctions therein have a same direction, and the number of the LED chips is sufficient large such that their driving voltage is close to an external driving voltage after LED light emitting strips are connected in series or in parallel and series.

5. The LED light bulb of claim 1, wherein the respective LED light emitting strips are interlace with each other, so that any two strips of the LED light emitting strips are not located in a same plane, so as to avoid generating shadow on the LED light bulb she caused by blocking light emitted from one of the LED light emitting strips by means of another LED light emitting strip.

6. The LED light bulb of claim 1, wherein the LED light emitting strips interlace with each other so as to be located in diagonal lines of respective faces of a virtual polyhedral column or polyhedral truncated cone.

7. The LED light bulb of claim 1, wherein the LED light emitting strip with the LED chips emitting 4 π light, comprises a transparent substrate and at least one series of the LED chips installed on the transparent substrate and connected in series in such a manner that the PN junctions therein have a same direction, and the LED chips having transparent chip substrates.

8. The LED light bulb of claim 7, further comprising an electrode leading device of the LED chips provided at two ends of the transparent substrate.

9. The LED light bulb of claim 8, further comprising a fixing means for fixing the electrode leading device at the two ends of the transparent substrate, and wherein the fixing means is made of high temperature glue, plastics, silver slurry or low melting glass.

10. The LED light bulb of claim 7, wherein the LED chips are blue-light or ultra-violet LED chips, RGB three primary colors LED chips or multi-primary colors LED chips.

11. The LED light bulb of claim 7, wherein a part of the LED chips are blue-light LED chips while the other part of the LED chips are red-light LED chips.

12. The LED light bulb of claim 10, further comprising a luminescent powder layer disposed around the LED chips and the transparent substrate installed with the LED chips.

13. The LED light bulb of claim 1, wherein the plurality of LED light emitting strips comprise four LED light emitting strips connected in series with third and fourth LED light emitting strips being connected intermediate the first and second LED light emitting strips and the metal wire comprises first, second, and third metal wire portions with:
 the first metal wire portion interconnecting the LED electrode leadwire at the second end of the first LED light emitting strip with the LED electrode leadwire at the second end of the third LED light emitting strip;
 the second metal wire portion interconnecting the LED electrode leadwire at the second end of the third LED light emitting strip with the LED electrode leadwire at the second end of the fourth LED light emitting strip; and
 the third metal wire portion interconnecting the LED electrode leadwire at the second end of the fourth LED light emitting strip with the LED electrode leadwire at the second end of the second LED light emitting strip, to permit unidirectional DC current flow through a first electrical power lead, the first LED light emitting strip, the first metal wire portion, the third LED light emitting strip, the second metal wire portion, the fourth LED light emitting strip, the third metal wire portion, the second LED light emitting strip, and a second electrical power lead.

* * * * *